(12) United States Patent
Van Beek et al.

(10) Patent No.: US 7,303,934 B2
(45) Date of Patent: Dec. 4, 2007

(54) METHOD FOR MANUFACTURING A MICRO-ELECTROMECHANICAL DEVICE AND MICRO-ELECTROMECHANICAL DEVICE OBTAINED THEREWITH

(75) Inventors: Jozef Thomas Martinus Van Beek, Eindhoven (NL); Margot Van Grootel, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/531,934

(22) PCT Filed: Oct. 17, 2003

(86) PCT No.: PCT/IB03/04586

§ 371 (c)(1),
(2), (4) Date: Apr. 19, 2005

(87) PCT Pub. No.: WO2004/037713

PCT Pub. Date: May 6, 2004

(65) Prior Publication Data

US 2006/0040505 A1 Feb. 23, 2006

(30) Foreign Application Priority Data

Oct. 24, 2002 (EP) .................................. 02079467

(51) Int. Cl.
*H01L 21/00* (2006.01)
(52) U.S. Cl. ............... 438/48; 438/50; 257/E23.129
(58) Field of Classification Search ............. 438/48, 438/50, 422
See application file for complete search history.

(56) References Cited

U.S. PATENT DOCUMENTS

2002/0117668 A1* 8/2002 Kim .......................... 257/59
2003/0104646 A1* 6/2003 Abe .......................... 438/48
2003/0232458 A1* 12/2003 Kleiman .................... 438/48
2005/0074919 A1* 4/2005 Patel et al. ................ 438/107

OTHER PUBLICATIONS

"Wafer-level packaged RF MEMS switches fabricated in a CMOS fab", pub on pp. 921-924 in the Proceedings of the IEDM (Inter'l Electron Devices Meeting), held from Dec. 3-5, 2001.
J. Buhler et al: "Double Pass Metallization for CMOS Aluminum Actuators", 8th Interntl Conf. on Solid State Sensors and Actuators and Eurosensors IX. Digest of Tech. Papers.

* cited by examiner

*Primary Examiner*—Michelle Estrada

(57) ABSTRACT

The invention relates to a method of manufacturing a micro-electromechanical device (10), in which are consecutively deposited on a substrate (1) a first electroconductive layer (2) in which an electrode (2A) is formed, a first electroinsulating layer (3) of a first material, a second electroinsulating layer (4) of a second material different from the first material, and a second electroconductive layer (5) in which a second electrode (5A) lying opposite the first electrode is formed which together with the first electrode (2A) and the first insulating layer (3) forms the device (10), in which after the second conductive layer (5) deposited, the second insulating layer (4) is removed by means of an etching agent which is selective with respect to the material of the second conductive layer (5). According to the invention for the first material and the second material materials are selected which are only limitedly selectively etchable with respect to each other and before depositing the second insulating layer (4) a further layer (6) is provided on top of the first insulating layer (3) of a further material that is selectively etchable with respect to the first material. In this way a silicon oxide and a silicon nitride may be applied for the insulating layers (3, 4) and thus the method according to the invention is very compatible with current IC processes. The second insulating layer (4) is preferably removed locally by etching, then the further layer (6) is completely removed by etching and, finally, the second insulating layer (4) is completely removed by etching.

12 Claims, 3 Drawing Sheets

Figure 1:
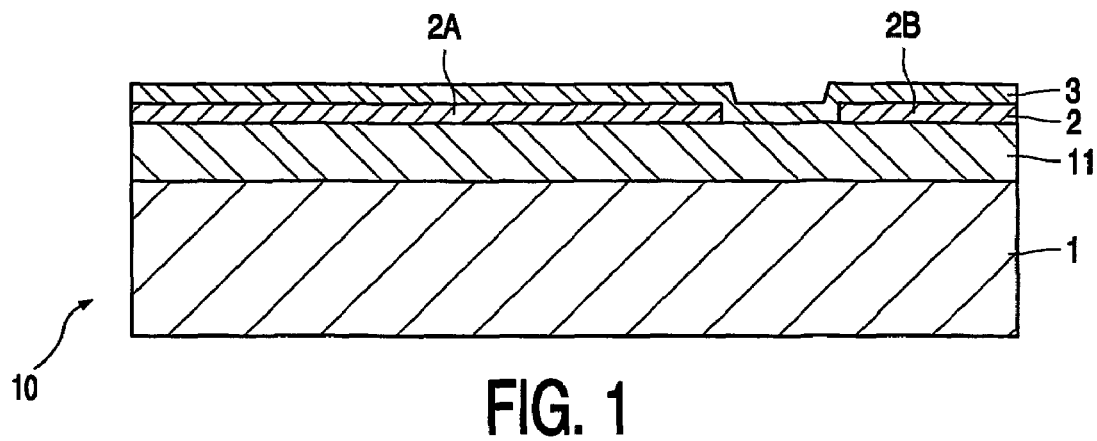

METHOD FOR MANUFACTURING A MICRO-ELECTROMECHANICAL DEVICE AND MICRO-ELECTROMECHANICAL DEVICE OBTAINED THEREWITH

The invention relates to a method for manufacturing a micro-electromechanical device, in which are consecutively deposited on a substrate a first electroconductive layer in which a first electrode is formed, a first electroinsulating layer of a first material, a second electroinsulating layer of a second material different from the first material, and a second electroconductive layer in which a second electrode lying opposite the first electrode is formed which together with the first electrode and the first insulating layer forms the device in which after the second conductive layer has been deposited, the second insulating layer is removed by means of an etching agent that is selective with respect to the material of the second conductive layer. With such a method an electronic device such as a tunable capacitor or an electronic switch can be manufactured in a simple manner. Thanks to smaller losses of a system manufactured with this method, the method is highly suitable for the manufacture of a system for Radio Frequency (RF) applications. The system and the method are also referred to as MEM(S) (=Micro-ElectroMechanical (Systems)).

A method of the type defined in the opening paragraph is known from the publication by H. A. C. Tilmans et al. entitled: "Wafer-level packaged RF MEMS switches fabricated in a CMOS fab", published on pp. 921-924 in the Proceedings of the IEDM (=International Electron Devices Meeting), held from Dec. 3 to 5, 2001 in Washington D.C. A CMOS fab (=Complimentary Metal Oxide Semiconductor Factory) here stands for a factory where (also) so-called ICs (=Integrated Circuits) are made. In the known method a substrate is covered by a metal layer from which a sub-electrode is formed which is covered by a first dielectric, in this case tantalum oxide. On it is deposited a second dielectric in the form of a photoresist. A second metal layer forming an upper electrode is deposited on this, after which the photoresist is removed by means of an oxygen plasma while the upper metal layer is not affected—and neither is the first dielectric.

A disadvantage of the known method is that a photoresist limits the process tolerance more particularly with respect to the upper metal layer. For example, this metal layer cannot be deposited at high temperatures because a polymer layer like a photoresist has an inclination towards flowing and/or degasing at temperatures beyond 200 to 300° C. Moreover, such a photoresist layer does not form a standard structuring layer in many customary IC processes.

It is an object of the present invention to provide a method of the type defined in the opening paragraph which does not have the above drawback at all or to a lesser extent and which does not only provide process tolerance but also fits in excellently in current IC processes.

For this purpose the method of the type defined in the opening paragraph is characterized in that for the first material and the second material are selected materials that can be etched only limitedly selectively with respect to each other and for depositing the second insulating layer on top of the first insulating layer a further layer is deposited of a further material that can be etched selectively with respect to the first material. The invention is first based on the surprising recognition that dropping the requirement that the second insulating layer is to be selectively etchable with respect to the first insulating layer offers the possibility of choosing two anorganic materials for the insulating layers, more particularly silicon nitride and silicon dioxide. Such materials do not flow and do not issue gases either, at any rate at higher temperatures customary in IC processes. Moreover, said specific materials are highly customary in IC processes. The invention is further based on the recognition that the drawback of these materials often not allowing to be selectively removed with respect to each other, as is the case with said materials, can be obviated by inserting between the two layers a further layer that can be etched selectively with respect to the first insulating layer.

Also the material of the second insulating layer is preferably chosen such that this layer allows to be selectively removed with respect to the further layer. In this way it is then possible for both the second insulating layer and the further layer—seen from above—to be removed consecutively without the first insulating layer being removed.

In a preferred embodiment of a method according to the invention the second insulating layer is first removed locally and preferably selectively with respect to the further layer up to the further layer, and then the further layer is removed after which the second insulating layer is removed in its entirety. By first removing the further layer before (the greater part of) the second insulating layer is removed, the former becomes accessible to the etching agent substantially over its entire surface in lieu of only laterally, which etching agent is the agent for removing this layer. In consequence, this etching agent need no longer be selective—or rather selective to a much lesser degree—with respect to the first insulating layer. This because the etching of the second insulating layer is now effected much faster. This causes the first insulating layer to be exposed much shorter to the etching agent and much less corroded by the etching agent, even though the etching agent is not selective or only limitedly selective with respect to this first insulating layer.

In an advantageous variant the same material is chosen for the further material and for the material of the conductive layers and for removing the further layer the second electroconductive layer is covered with a masking layer masking the further layer from the etching agent. In consequence, the number of materials can easily be limited to the most current materials in IC processes such as—in addition to the silicon oxide and silicon nitride mentioned earlier—aluminum, which is a highly customary contact metal in IC processes. A photoresist may be applied as a masking layer, which photoresist can easily be brought into the desired pattern by means of photolithography. Unlike being used as a structuring layer, the use of a photoresist as such and for the purpose mentioned here is absolutely common in IC processes.

As observed earlier, silicon nitride is preferably chosen for the first material and silicon (di)oxide for the second material. As an etching agent for these materials is preferably used a—hardly selective indeed—aqueous solution of $NH_4F$ and HF. Aluminum is preferably used as the material for the conductive layers and for the further layer, as has also been mentioned earlier. This material can easily be removed selectively with respect to silicon nitride by an etching agent based on a mixture of phosphoric acid, acetic acid and sulfuric acid.

Preferably both the first conductive layer and the second conductive layer are formed as two interrupted parts, the interrupted parts of the second conductive layer being formed on the interrupted parts of the first conductive layer. The portion of the first conductive layer that is located underneath the portion of the second conductive layer that forms the upper electrode of the device acts as the etch top layer for providing the necessary opening at that spot in the first insulating layer. The other portion of the second conductive layer that is located on the lower electrode of the device acts as an easily accessible and low-ohmic connection area of the lower electrode.

In a further advantageous variant all layers mentioned are deposited by means of CDV or sputtering. They are techniques that are commonly used for the manufacture of ICs and particularly in the end phase thereof, because they can be implemented at relatively low temperatures.

The invention further relates to a method for manufacturing an electronic device implementing a method according to the invention.

The invention also relates to a micro-electromechanical device obtained by implementing a method according to the invention. The device is preferably a tunable capacitor. By means of an electric voltage the upper electrode can be bent towards the lower electrode so that the capacitance formed by the electrodes increases continuously. Thanks to the presence of the first insulating layer, short-circuit is then avoided. It is then also possible to easily switch the capacitor between a low capacitance during which the upper electrode runs parallel with the lower electrode and a high capacitance during which the upper electrode is pressed against the insulating layer by means of an electric voltage.

The invention finally relates to an electronic device comprising a micro-electromechanical device obtained from implementing a method according to the invention.

The invented method's excellent compatibility with current IC techniques provides that a device manufactured with a method according to the invention can also be integrated with an IC in an extremely simple manner. Needless to observe that the device can also be manufactured as a discrete component or with only a limited number of other (semiconductor) components.

Figure 2:
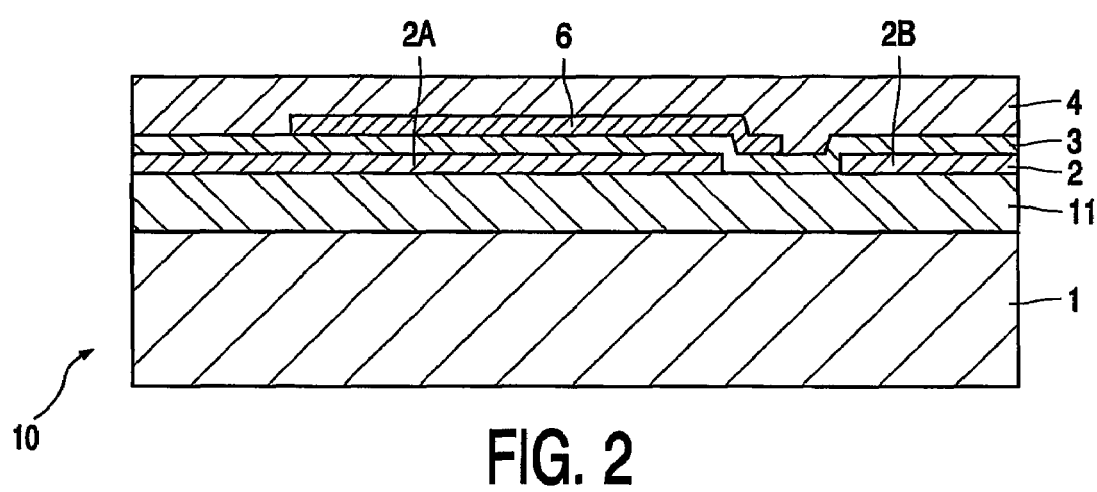
Figure 3:
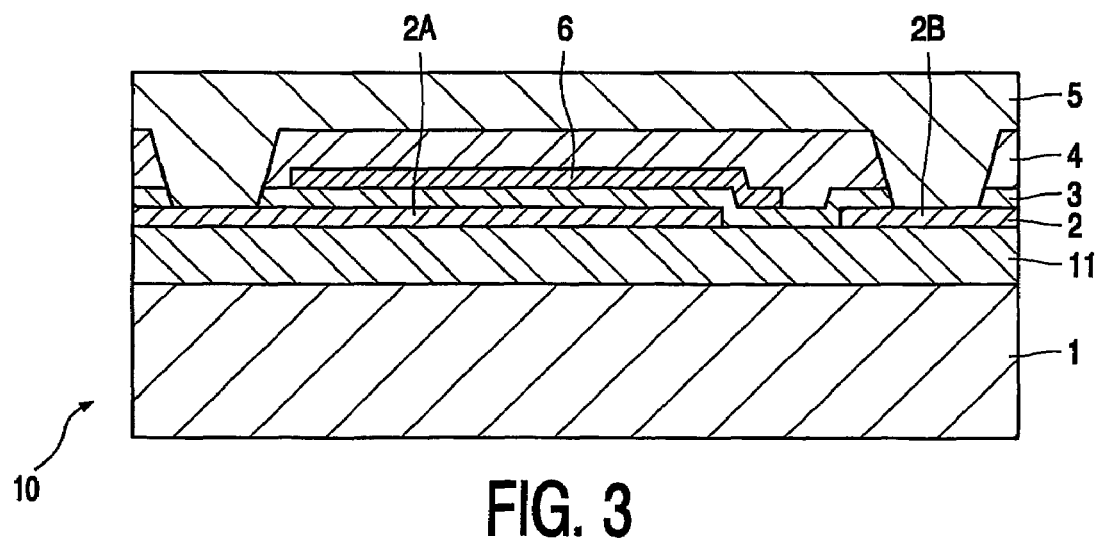
Figure 4:
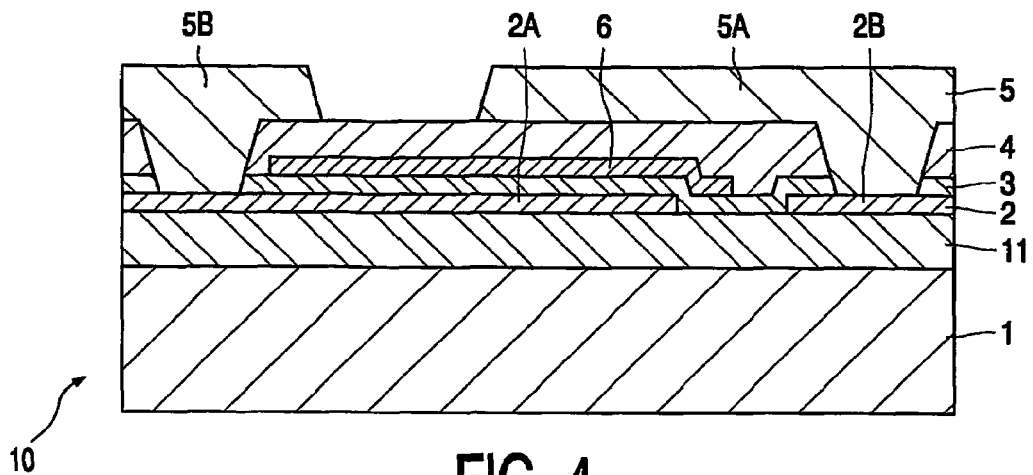
Figure 5:
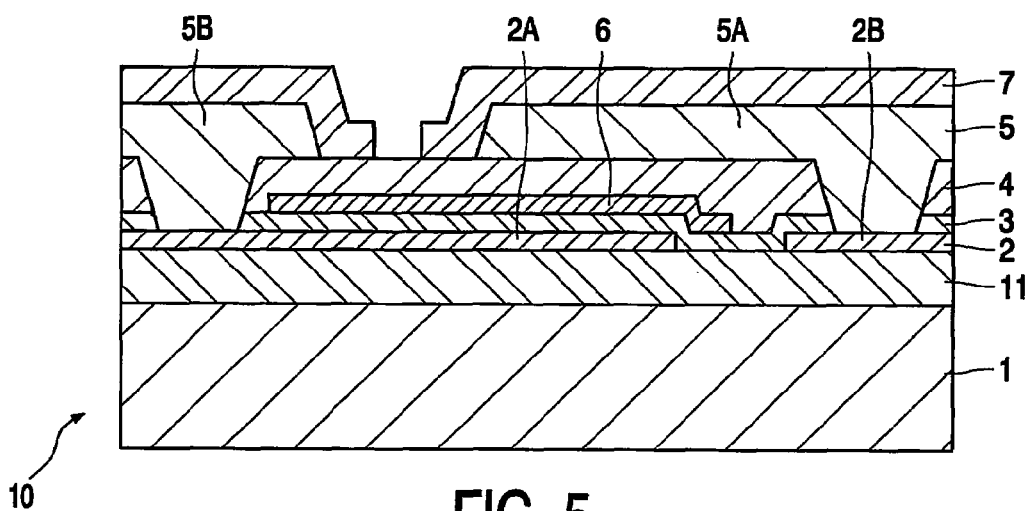
Figure 6:
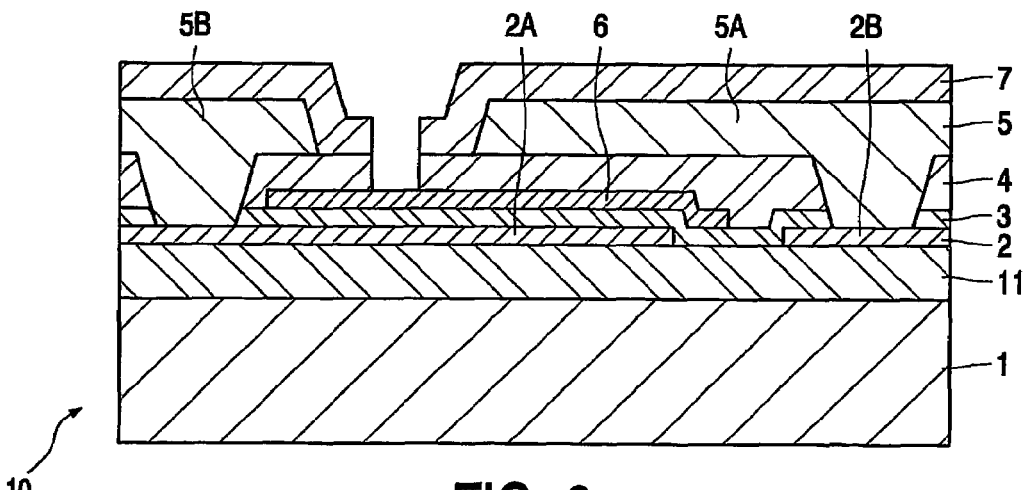
Figure 7:
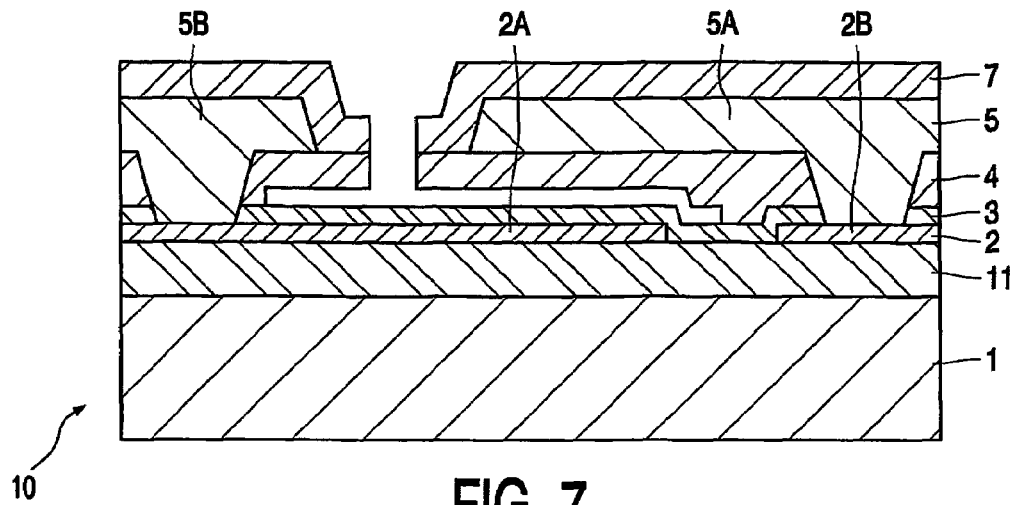
Figure 8:
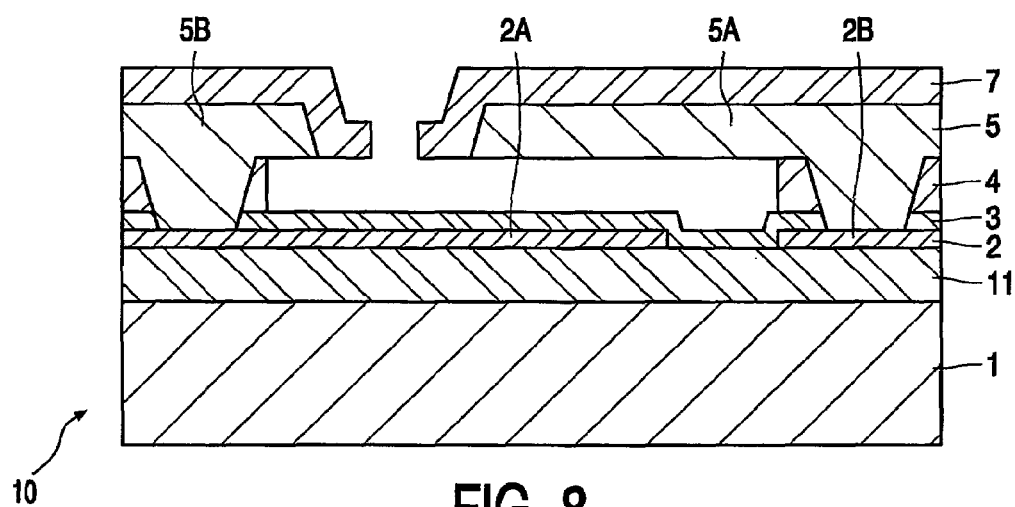
Figure 9:
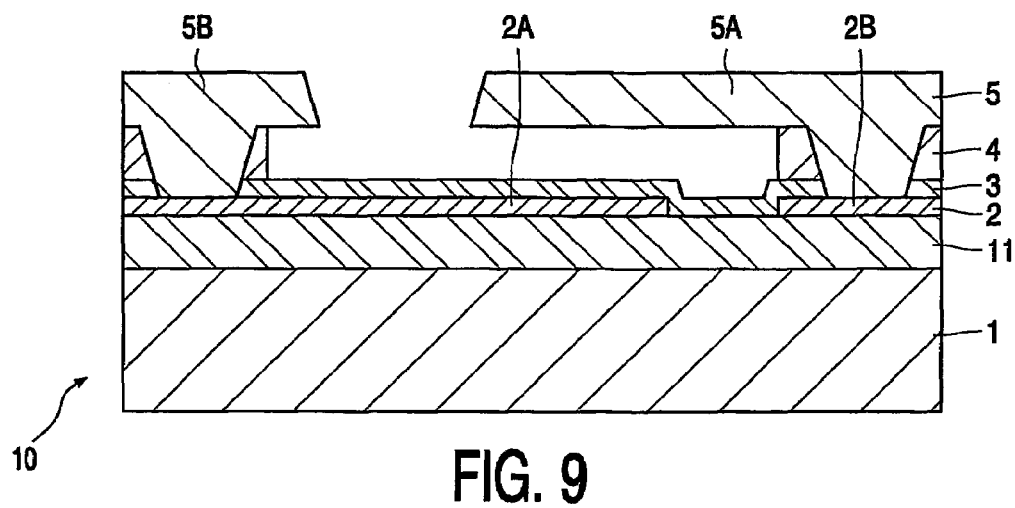

The invention will now be further elucidated with reference to several examples of embodiment and the drawing in which:

FIGS. 1 to 9 show schematically and in cross-sectional views perpendicular to the thickness direction a micro-electromechanical device in successive stages of manufacture by means of an embodiment of a method according to the invention.

The Figures are not drawn to scale and several dimensions, such as dimensions in the thickness direction, are shown disproportionately for reasons of clarity. Like areas or component parts have as much like reference characters as possible in the various Figures.

FIGS. 1 to 9 show schematically and in cross-sectional views perpendicular to the thickness direction a micro-electromechanical device in successive stages of manufacture by means of an embodiment of a method according to the invention. A high-ohmic silicon substrate 1, for example having a resistivity of at least 5Ω and having dimensions customary in IC technology is assumed (see FIG. 1). By means of thermal silicon oxidation a 0.5 µm thick layer 11 of silicon dioxide is first formed on top of this substrate. Then this layer is covered with a 0.5 µm thick layer 2 of aluminum. This layer 2 is divided into two parts 2A, 2B by means of photolithography and etching. Subsequently, a 0.5 mm thick layer 3 of silicon nitride is deposited for example by means of sputtering.

Then (see FIG. 2) a 0.5 mm thick aluminum layer 6 is sputtered onto the nitride layer 3 and shaped to the right pattern by means of photolithography and etching. This is covered by a 0.5 mm thick layer 4 of silicon dioxide deposited for example by means of sputtering.

Then openings are locally made (see FIG. 3) in the insulating layers 3, 4 by means of photolithography and etching. The aluminum layer 2 then acts as an etch stop layer. A 5 mm thick layer 5 of aluminum is then deposited on the entire surface of the device 10 by means of sputtering. The layer 5 (see FIG. 4) is split into two parts 5A, 5B by means of photolithography and etching, which parts are located on top of parts 2B and 2A respectively, of the first conductive layer 2. The part 5A of the conductive layer 5 forms, together with the part 2A of the conductive layer 2 which is covered by the silicon nitride layer 3, the device 10 to be built. The layer 6—which is made of aluminum here too—does not contact the parts 5A, 5B here.

Subsequently, in this example (see FIG. 5) a masking layer 7 of photoresist is deposited on the second conductive layer 5 and shaped to a pattern by means of photolithography. Then (see FIG. 6) the silicon oxide layer 4 is locally removed—from the opening in the masking layer 7—by means of an etching agent in this case an aqueous solution of $NH_4F$ and HF up to the further aluminum layer 6.

The method according to the invention is proceeded with (see FIG. 7) by removing the further layer 6 selectively with respect to the first insulating layer 3—and here also selectively with respect to the second insulating layer 4—at a temperature of 30 degrees Centigrade by means of an etching agent that contains phosphoric acid, acetic acid and sulfuric acid. This provides a slot-like opening in the device 10, which slot exposes a large part of the—underside of the—second insulating layer 4. This layer 4 can then be removed (see FIG. 8) by etching with an $NH_4F$ and HF-based etching agent. By exposing the insulating layer 4, this etching may be performed extremely rapidly and thus without the insulating layer 3 of silicon nitride being appreciably corroded. This despite the fact that the material of the insulating layer 3, silicon nitride in this case, as such is corroded indeed by an $NH_4F$ and HF-based etching agent.

Thus (see FIG. 9), after the masking layer 7 has been removed, the stage is reached in which the device 10 is ready for a possible individualization, for example by means of sawing and for final mounting and/or enveloping. The parts 5A, 5B of the conductive layer 5 may then function as electrical connection areas or so function when used with the device. The device 10 manufactured in this example can eminently function as a tunable capacitor (either discrete or not). Likewise the device 10 can easily be switched between a high-capacitance state and a low-capacitance state without short-circuit being caused by this action. If need be, the device 10 can be integrated with an IC. This is also thanks to the eminent compatibility of the method according to the invention and the manufacturing processes customary in the IC world. The overall dimensions of the capacitor 10 manufactured in this example are 500 µm×500 µm.

The invention is not restricted to the example of embodiment described because within the scope of the invention there are a great many variations and modifications possible for a man of skill in the art. For example, devices may be manufactured having a different geometry and/or different dimensions. In lieu of an Si substrate, it is also possible to use a glass, ceramic or plastic substrate. Also a metal substrate is conceivable. Furthermore, it is once again observed that the device may comprise further active and passive semiconductor elements or electronic components such as diodes and/or transistors and resistore and/or capacitors, either in the form of an IC or not. Manufacture will then obviously be effectively adapted.

The invention claimed is:

1. A method for manufacturing a micro-electromechanical device (10), in which are consecutively deposited on a substrate (1) a first electroconductive layer (2) in which a first electrode (2A) is formed, a first electroinsulating layer (3) of a first material, a second electroinsulating layer (4) of a second material, different from the first material, and a second electroconductive layer (5) in which a second electrode (5A) lying opposite the first electrode is formed which together with the first electrode (2A) and the first insulating layer (3) forms the device (10), in which after the second conductive layer (5) has been deposited, the second insulating layer (4) is removed by means of an etching agent that is selective with respect to the material of the second conductive layer (5), characterized in that for the first material and the second material are selected materials that can be etched only limitedly selectively with respect to each other and for depositing the second insulating layer (4) on top of the first insulating layer (3) a further layer (6) is deposited on top and in direct contact with the first electroinsulating layer of a further material that can be etched selectively with respect to the first material.

2. A method as claimed in claim 1, wherein the material of the further layer (6) is selected such that the second insulating layer (4) can be removed selectively with respect to the further layer (6).

3. A method as claimed in claim 1, wherein the second insulating layer (4) is first removed locally and preferably selectively with respect to the further layer (6) up to the further layer (6), then the further layer (6) is removed selectively with respect to the first insulating layer (3) after which the second insulating layer (4) is removed in its entirety.

4. A method as claimed in claim 3, wherein for the further material of the further layer (6) and for the material of the conducting layers (2,5) the same material is chosen and for removing the further layer (6) the second electroconductive layer (5) is covered with a masking layer (7) for the etching agent of the further layer (6).

5. A method as claimed in claim 1, wherein silicon nitride is chosen for the first material and silicon oxide for the second material.

6. A method as claimed in claim 5, wherein an aqueous solution of ammonium fluoride ($NH_4F$) and nitrogen fluoride (HF) is chosen as an etching agent fur removing the second insulating layer (4).

7. A method as claimed in claim 1, wherein the electroconductive layers (2, 5) and the further layer (6) are made of aluminum.

8. A method as in claim 7, wherein a mixture of phosphoric acid, acetic acid and sulphuric acid is chosen as an etching agent for the further layer (6).

9. A method as claimed in claim 1, wherein both the first conductive layer (2) and the second conductive layer (5) are formed as two interrupted parts ((2A, 2B), (5A, 5B)), the interrupted parts (5A, 5B) of the second conductive layer (5) being formed on top of the interrupted parts (2B, 2A) of the first conductive layer (2).

10. A method as claimed in claim 1, wherein all layers (2, 3, 4, 5, 6, 11) are deposited by means of CVD or sputtering.

11. A micro-electromechanical device (10) obtained from implementing a method as claimed in claim 1.

12. A micro-electromechanical device (10) as claimed in claim 11 and comprising a tunable capacitor.

* * * * *